United States Patent
Renfro et al.

(10) Patent No.: US 7,077,661 B2
(45) Date of Patent: Jul. 18, 2006

(54) SOCKET FOR HAVING THE SAME CONDUCTOR INSERTS FOR SIGNAL, POWER AND GROUND

(75) Inventors: Tim Renfro, Mesa, AZ (US); Kris Frutschy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/782,689

(22) Filed: Feb. 18, 2004

(65) Prior Publication Data

US 2005/0181639 A1   Aug. 18, 2005

(51) Int. Cl.
  H01R 12/00   (2006.01)
  H01R 11/18   (2006.01)
  H01R 13/00   (2006.01)
  H05K 1/00    (2006.01)
(52) U.S. Cl. ......................................... 439/66; 439/482
(58) Field of Classification Search ................. 439/66, 439/482, 73, 60, 74, 588, 80, 82
See application file for complete search history.

(56) References Cited

U.S. PATENT DOCUMENTS

| | | | |
|---|---|---|---|
| 3,959,868 A * | 6/1976 | Mathe ........................... | 29/749 |
| 4,220,393 A * | 9/1980 | Ammon et al. ............... | 439/682 |
| 4,494,172 A | 1/1985 | Leary et al. | |
| 4,868,980 A | 9/1989 | Miller, Jr. | |
| 5,102,352 A | 4/1992 | Arisaka | |
| 5,538,433 A | 7/1996 | Arisaka | |
| 6,016,254 A | 1/2000 | Pfaff | |
| 6,210,176 B1 | 4/2001 | Hsiao | |
| 6,471,538 B1 * | 10/2002 | Zhou et al. .................. | 439/482 |
| 6,736,665 B1 * | 5/2004 | Zhou et al. .................. | 439/482 |
| 6,805,561 B1 * | 10/2004 | Walkup et al. ................ | 439/66 |
| 2001/0004556 A1 * | 6/2001 | Zhou et al. .................... | 439/66 |
| 2004/0077190 A1 * | 4/2004 | Huang et al. ................. | 439/66 |
| 2004/0192081 A1 * | 9/2004 | Koopman et al. ............ | 439/66 |
| 2004/0203264 A1 * | 10/2004 | Liao et al. .................... | 439/66 |

OTHER PUBLICATIONS

PCT Search Report, PCT/US2005/001563, Jun. 14, 2005 Intel Corporation, 7 pages.

* cited by examiner

*Primary Examiner*—Chandrika Prasad
(74) *Attorney, Agent, or Firm*—Blakely, Sokoloff, Taylor & Zafman LLP

(57) ABSTRACT

A socket for a microelectronic component is provided. The socket contains power, ground and signal conductors. It further contains a plurality of electrical conductors, each with a respective stop component, interconnection element, spring portion and protrusions. A plurality of protrusions is equal amongst each respective electrical conductor and identical in height. A plurality of electrical conductors are inserted into a respective opening within the socket body, a select plurality of electrical conductors electrically connects, via protrusions that frictionally fit, to either a power, ground or signal plane for the purpose of providing current to the integrated circuit. While a first plurality of electrical conductors are electrically connected through the same power, ground or signal conductor, they are also electrically disconnected from a second plurality of electrical conductors that are electrically connected though another conductors, not the same as the first.

18 Claims, 5 Drawing Sheets

SOCKET FOR HAVING THE SAME CONDUCTOR INSERTS FOR SIGNAL, POWER AND GROUND

BACKGROUND OF THE INVENTION

1) Field of the Invention

This invention relates to a socket for a microelectronic component.

2) Discussion of Related Art

Integrated circuits are usually manufactured in and on silicon wafers that are subsequently singulated into individual dies. A microelectronic die is mounted on a package substrate for purposes of rigidity and to provide power, ground and signal to the integrated circuit. A package substrate is inserted into a holding formation of a socket that is mounted on a motherboard, where contacts on the opposing side of the package substrate electrically connect to contacts within the holding formation of the socket.

The socket has a plurality of openings within the socket body. Electrical conductors are inserted into the openings and make contact with electrical planes within the socket and also serve to electrically connect with lower contacts on the package substrate. The electrical conductors also have opposing contacts on the lower side of the socket to electrically connect to upper contacts on a carrier substrate. The socket includes clamps that generate a force on the lands of the package substrate to counter the force generated by spring portions of the electrical conductors when the package substrate is inserted into the holding formation of the socket.

A plurality of electrical conductors can provide power, ground or signal to the integrated circuit. For example, the plurality of electrical conductors electrically contacting a power plane, are all electrically connected, and electrically disconnected from the ground and signal planes.

The disadvantage of previous socket technology was meeting current power delivery requirements. Current high power delivery requirements equates to high resistance and inductance at the electrical contacts, resulting in a decrease in power delivery and performance to the integrated circuit.

BRIEF DESCRIPTION OF THE DRAWINGS

The invention is described by way of example with reference to the accompanying drawings wherein.

DETAILED DESCRIPTION OF THE INVENTION

Figure 1:
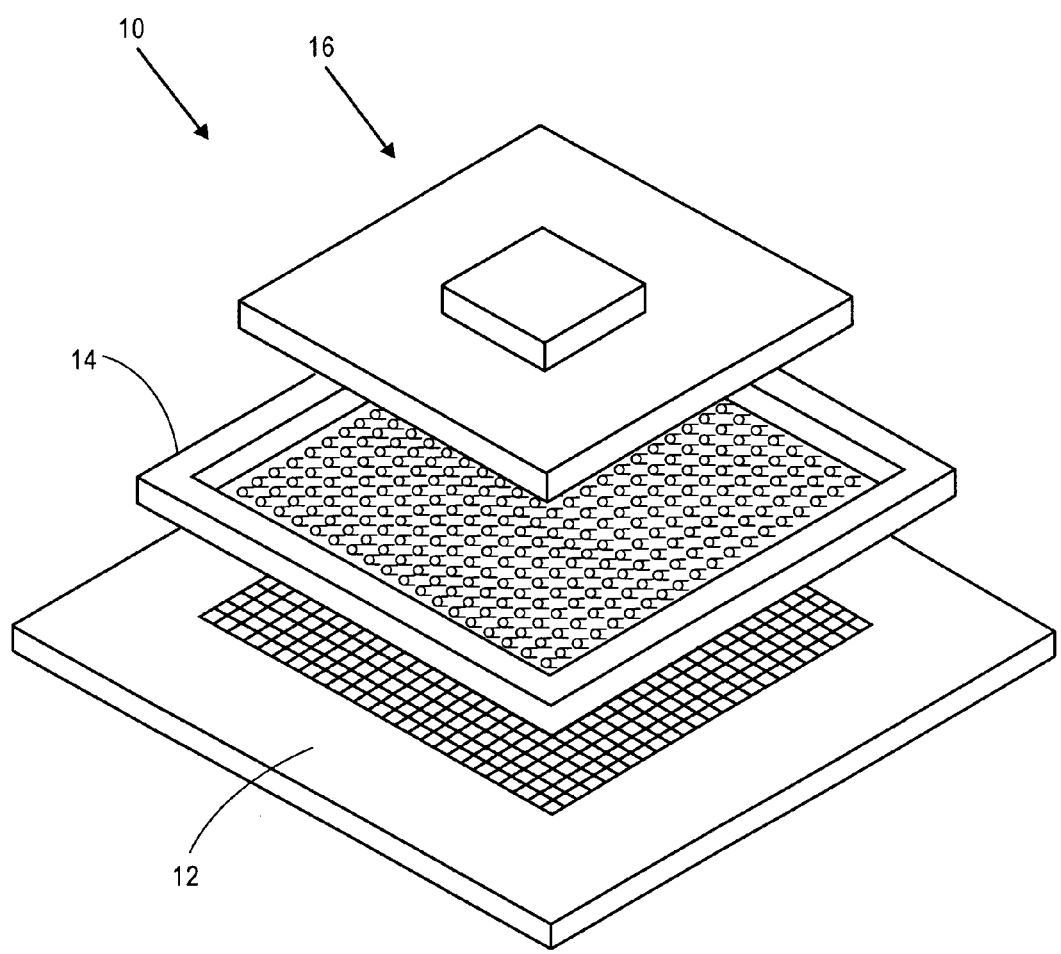
FIG. 1 is a perspective view of components of a microelectronic assembly, including; a microelectronic die and a package substrate, which make up a microelectronic component, a socket and a carrier substrate.

FIG. 1 of the accompanying drawings illustrates a microelectronic assembly 10 according to an embodiment of the invention, which includes a carrier substrate 12, a socket 14 and a microelectronic component 16.

Figure 2:
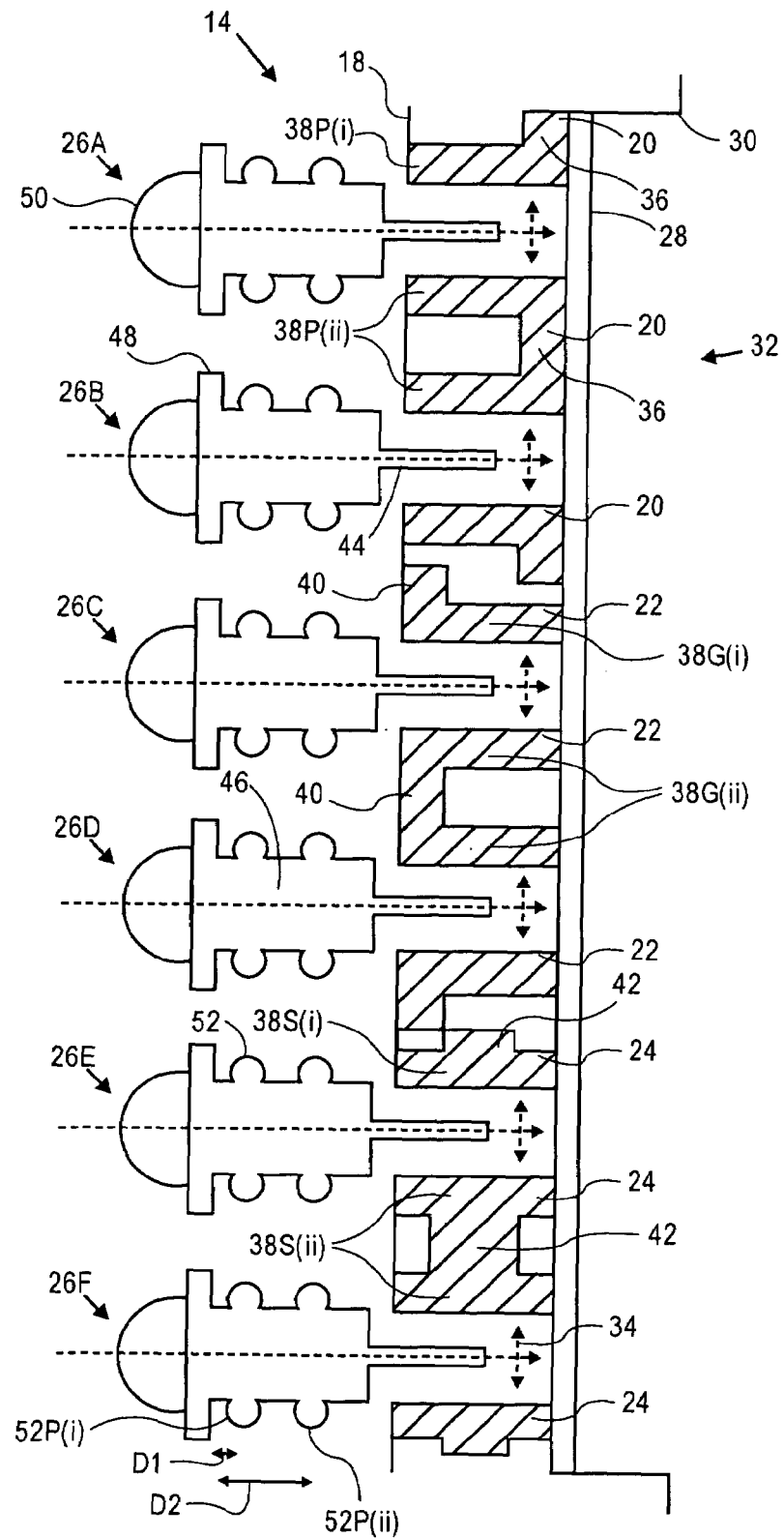
FIG. 2 is a cross-sectional view of the socket in detail, including a plurality of electrical conductors to be inserted and a socket body.

FIG. 2 illustrates the components of the socket 14 in more detail, including a socket body 18, a power conductor 20, a ground conductor 22 and a signal conductor 24 and a plurality of electrical conductors 26.

The socket body 18 includes alternating insulating and conductive layers. The conductive layers include the power conductor 20, ground conductor 22, and signal conductor 24. The socket body 18 has a horizontal base portion 28 and vertical sidewalls 30 that jointly form a recess holding formation 32 for receiving the microelectronic component 16. An array of horizontally spaced vertically extending openings 34 are formed within the base portion 28 and socket body 18.

The power conductor 20 includes a horizontal power plane 36 and a plurality of vertical liners 38P(i) and 38P(ii). The power plane 36 is formed on an upper surface of the horizontal base portion 28. The vertical liners 38P(i) and 38P(ii) line the inside of two respective openings 34. The power plane 36 is connected to all the vertical liners 38P(i) and 38P(ii), and is electrically disconnected from ground conductor 22 and signal conductor 24.

The ground conductor 22 includes a horizontal ground plane 40 and a plurality of vertical liners 38G(i) and 38G(ii). The ground plane 40 is formed on the lower level of the socket body 18. The vertical liners 38G(i) and 38G(ii) line the inside of two respective openings 34. The ground plane 40 is connected to all the vertical liners 38G(i) and 38G(ii).

The signal conductor 24 includes a horizontal signal plane 42 and a plurality of vertical liners 38S(i) and 38S(ii). The signal plane 42 is formed between the power planes 36 and ground planes 40, and is electrically isolated from the power conductors 20 and ground conductors 22 of the socket body 18. The vertical liners 38S(i) and 38S(ii) line the inside of two respective openings 34. The signal conductor 24 is connected to all the vertical liners 38S(i) and 38S(ii).

Each electrical conductor 26 includes a respective spring portion 44, interconnection element 46, stop component 48, solder ball 50 and protrusions 52. The spring portion 44 extends upwardly from the center of interconnection element 46 and has a diameter smaller than one of the openings 34. The interconnection element 46 has a diameter slightly smaller than the diameter of the openings 34. The stop component 48 has a diameter that is larger than that of the openings 34. Solder ball 50 is located at a bottom surface of the stop component 48.

Each protrusion 52 is circumferentially around an outer surface of the respective interconnection element 46. A distance D1 from the stop component 48, to a first lowest protrusion 52P(i) is substantially the same on all the interconnection elements 46. In addition, a distance D2 to a second higher protrusion 52P(ii) is substantially the same height as each interconnection element 46.

Figure 3:
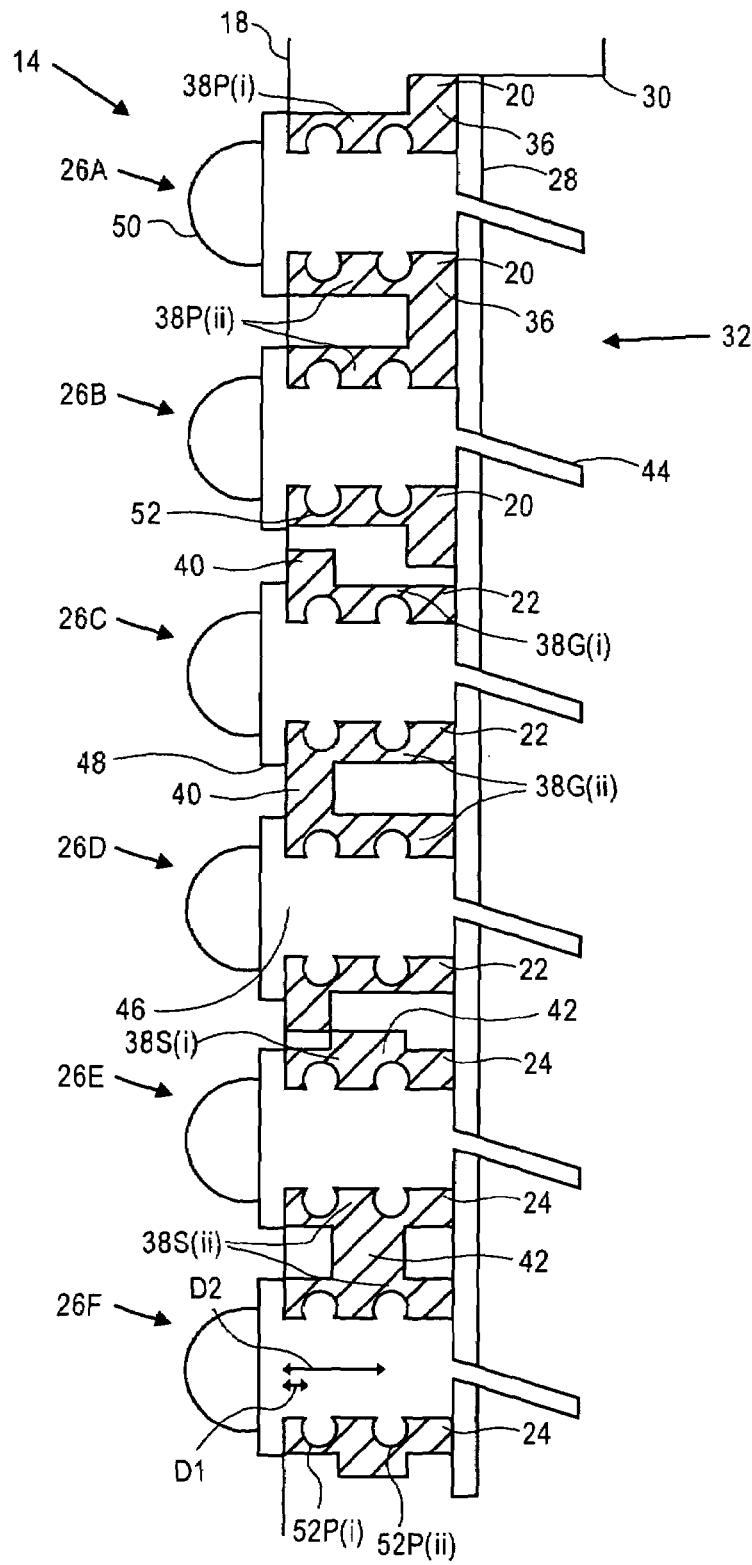
FIG. 3 is a cross-sectional view of the socket of FIG. 2, illustrating the insertion of the plurality of electrical conductors into the socket body.
Figure 6:
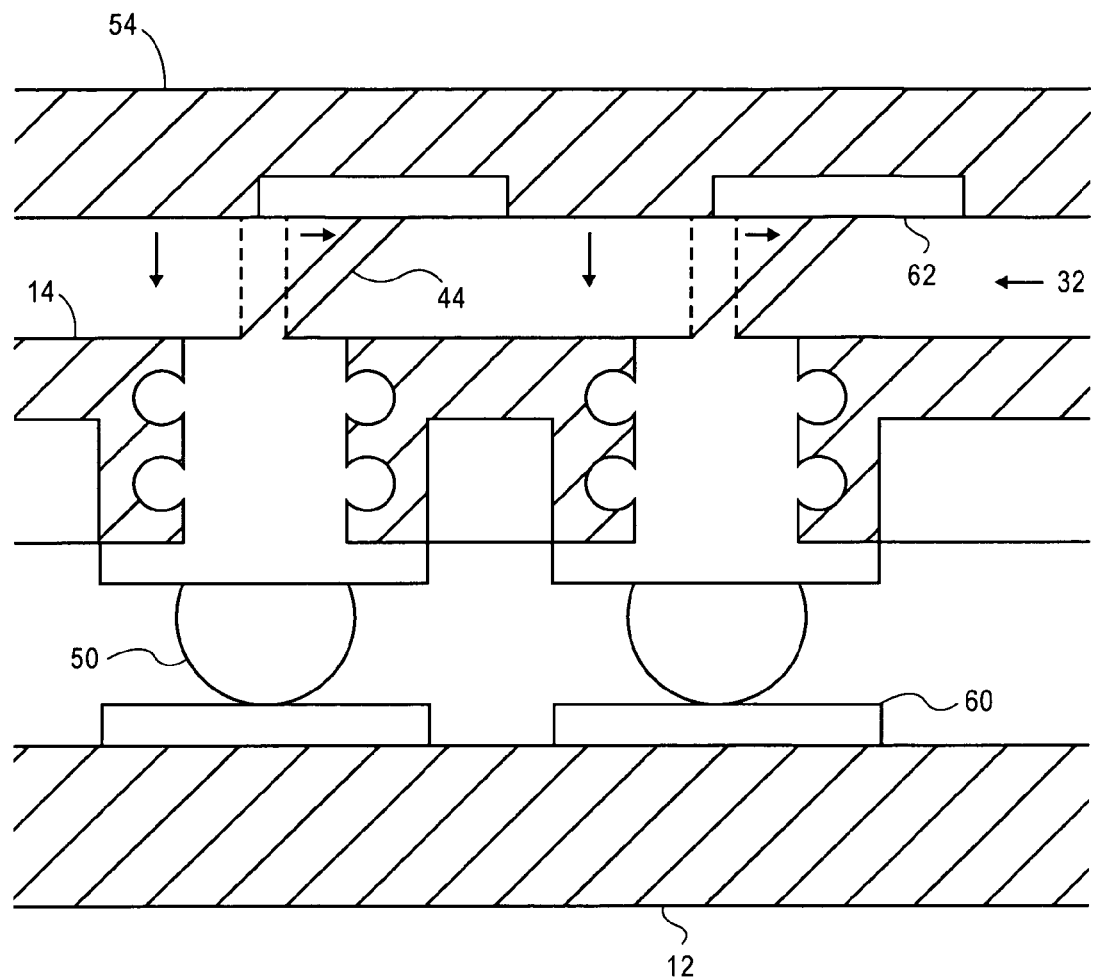
FIG. 6 is cross-sectional view of the package substrate, the socket and the carrier substrate, illustrating the movement of spring portions in response to the insertion of the package substrate during assembly.

As FIG. 3 illustrates, the spring portion 44 enters the opening 34, followed by the interconnection element 46. The protrusions 52 frictionally fit to the sides of the openings 34 contacting either the power conductor 20, the ground conductor 22, or the signal conductor 24. The stop component 48 limits the distance that each respective electrical conductor 26 travels into the socket body 18. The spring portion 44 then extends this same distance into the recess holding formation 32 and is subsequently bent as illustrated in FIG. 6. The solder balls 50 are located at the bottom surface of the stop component 48, and as illustrated in FIG. 6, each respective solder ball 50 is electrically connected to a respective upper carrier contact terminal 60 of the carrier substrate 12.

The electrical conductors 26A and 26B electrically connect to the power conductor 20 and are electrically disconnected from the ground conductor 22 and signal conductor 24. The electrical conductors 26C and 26D electrically connect to the ground conductor 22 and are electrically disconnected from the power conductor 20 and signal conductor 24. The electrical conductors 26E and 26F are electrically connected to the signal conductor 24 and electrically isolated from the power conductor 20 and ground conductor 22.

Figure 4:
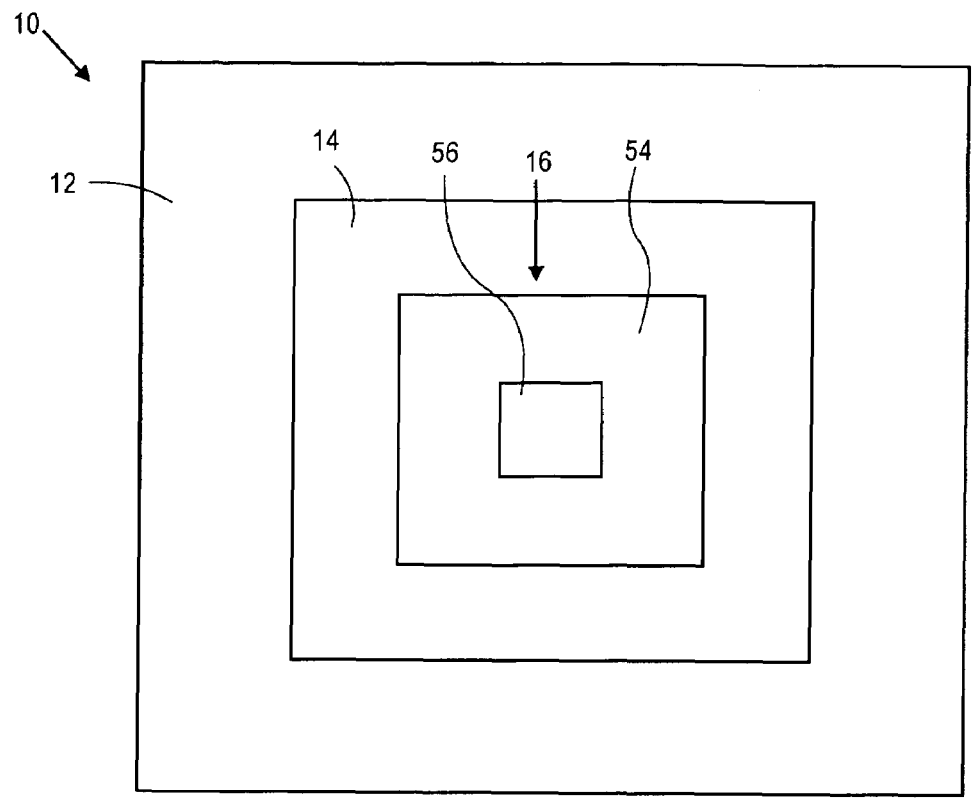
FIG. 4 is a top view of the assembled microelectronic assembly, the components of which consist of; a microelectronic die and a package substrate, which make up a microelectronic component, a socket and a carrier substrate.
Figure 5:
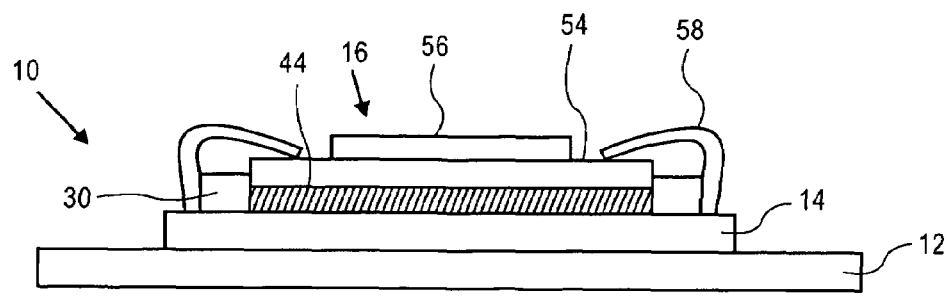
FIG. 5 is a side-view of the assembled microelectronic assembly of FIG. 4, including; the microelectronic die and package substrate, which make up the microelectronic component, the socket and the carrier substrate.

FIGS. 4 and 5 illustrate the components of the microelectronic assembly 10 which include the carrier substrate 12, the socket 14, the microelectronic component 16, but further includes clamps 58. The microelectronic component 16 includes a package substrate 54 and a microelectronic die 56 mounted to the package substrate 54.

The package substrate 54 is slightly smaller and fits tightly within the recess holding formation 32 of the socket 14. The microelectronic die 56 has lower terminal contacts that are electrically and structurally connected to upper terminal contacts of the package substrate 54, thus the package substrate 54 provides structural rigidity to the microelectronic component 16 and electrical communication to and from an integrated circuit formed in the microelectronic die 56.

The clamps 58 are located outside the sidewalls 30 and housed on the socket 14. The microelectronic component 16 is lowered into the recess holding formation 32, the clamps 58 exert force on the package substrate 54 in opposition to force generated by spring portions 44, depressing the spring portions 44 of the electrical conductors 26, resulting in a high-quality electrical connection.

FIG. 6 illustrates the insertion of the package substrate 54 of the microelectronic component 16 into the recess holding formation 32. Each respective spring portion 44 depresses, electrically contacting a respective package terminal 62 formed on a lower side of the of the package substrate 54 of the microelectronic component 16. The carrier substrate 12, including upper carrier contact terminals 60, each respectively contacts a respective solder ball 50 of the socket 14.

In use, the socket 14 provides transmission of charge to and from the integrated circuit. Electrical current is received by the socket 14 through the carrier substrate 12, upper carrier contact terminals 60 and to the respective solder ball 50. Interconnection element 46 of the respective electrical conductor 26 receives charge though the solder ball 50 and emits the respective electrically connected conductor, being ground, power or signal, to the package terminal 62 of the package substrate 54 though the spring portion 44 and to a second electrically connected interconnection element of an electrical conductor 26 through protrusions 52.

Power flows though electrically connected electrical conductors 26A and 26B, while electrically disconnected from ground and signal planes, ground flows though electrically connected electrical conductors 26C and 26D, while electrically disconnected from power and signal planes and signals flow through electrically connected electrical conductors 26E and 26F.

The package terminal 62 on the package substrate 54 transmits the charge received from the spring portion 44 to the microelectronic die 56. The microelectronic die 56 has lower terminal contacts that are electrically and structurally connected to upper terminal contacts of the package substrate 54. The microelectronic die 56 provides electrical communication to and from an integrated circuit formed within the microelectronic die 56.

Integrated circuits operate at a specific frequency. Frequency will determine how fast instructions are computed within a given computer. Computers are processing larger amounts of information and at greater speeds, requiring more power. In order to meet increased power demands, a reduction in electrical parasitics is essential. One advantage of the socket design includes the embedding of planes within the socket body 18 in a way that allows for lateral flow of charge, this lowers resistance, inductance and creates a more efficient power delivery to the integrated circuit.

The socket design also provides for an accurate cost-effective ease of assembly. Its advantage is its ability to provide for a insertion of each electrical conductor 26, where each electrical conductor 26 has a first set of protrusions 52P(i) located at substantially the same distance from the stop component 48 and a second set of protrusions 52P(ii), located higher than the first, are at substantially the same distance from the stop component 48 and can be inserted into any opening 34 within the socket body 18, thus eliminating error in electrical connections with the power conductor 20, ground conductor 22, or signal conductor 24 and the need to distinguish interconnection elements during assembly.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinary skilled in the art.

What is claimed:

1. A socket comprising:
    socket body having a socket holding formation and a plurality of horizontally spaced socket openings therein;
    first and second electrically disconnected conductors carried by the socket body;
    a plurality of interconnection elements;
    at least a first protrusion on a side surface of each interconnection element, each interconnection element being inserted into a respective socket opening with the respective protrusion on the respective interconnection element frictionally contacting a surface of the respective opening, first and second sets of the interconnection elements being electrically connected to the first and second conductors respectively;
    lower socket contacts, electrically connected to the interconnection elements, on a lower side of the socket body; and
    upper socket contacts, electrically connected to the interconnection elements, in the formation on an upper side of the socket body, the first protrusion on selected interconnection elements of the first set being at substantially the same height as the first protrusion on selected interconnection elements of the second set.

2. The socket as in claim 1, wherein the socket holding formation is formed by recess and sidewalls.

3. The socket as in claim 2, further comprising a plurality of springs held in the recess of the socket, each upper socket contact being on a respective spring.

4. The socket as in claim 3, wherein a means for retaining a microelectronic package deforming the springs against the spring force once inserted.

5. The socket as in claim 1, wherein the first electrically disconnected conductor includes a power plane and liners in one of the socket openings of the first set.

6. The socket as in claim 5, the second electrically disconnected conductor includes a ground plane and liners in one of the socket openings of the second set.

7. The socket as in claim 6, further comprising of an insulation layer at a different elevation than the power and ground planes.

8. The socket as in claim 7, further comprising a signal interconnection element, and a third plane, other than the power and ground plane, connected to the signal interconnection element and electrically isolated from the power and ground planes.

9. The socket as in claim 1, further comprising a stop component at a base of each interconnection element to limit a distance that the respective interconnection element is inserted into the socket opening.

10. The socket as in claim 9, wherein the distance between the stop component and the protrusion is substantially the same height on each interconnection element of the first and second sets of interconnection elements.

11. The socket as in claim 1, comprising a second protrusion on the selected interconnection element of the first set and a second protrusion on the selected interconnection element of the second set.

12. The socket as in claim 11, where the second protrusions are at substantially the same height.

13. The socket as in claim 12, wherein the protrusions of the select interconnection element of the first set are electrically disconnected from the plurality of protrusions on the second set.

14. The socket as in claim 1, further comprising solder balls each attached to a respective interconnection element, each having a lower surface forming a respective one of the lower socket contact.

15. A method of constructing a socket for a microelectronic component, comprising:

inserting a plurality of interconnection elements into respective socket openings of a socket body, a protrusion on each interconnection element frictionally contacting the openings, the protrusions on a first set of the interconnections element contacting a power conductor and the protrusions on a second set of the interconnection elements contacting a ground conductor and being at the same height as the protrusions of the first set.

16. The method as in claim 15, further comprising, a second protrusion at substantially the same height on first and second sets of interconnection elements, being inserted into the socket openings contacting power and ground planes respectively.

17. The method as in claim 16, wherein the interconnection elements are identical.

18. An electronic assembly, comprising:

a carrier including a carrier substrate and upper carrier contacts formed on the carrier substrate;

a socket including a socket body having a socket holding formation and a plurality of horizontally spaced socket openings there in; first and second electrically disconnected conductors carried by the socket body; a plurality of interconnection elements; at least one protrusion on a side surface of each interconnection element, each interconnection element being inserted into a respective socket opening with the respective protrusion on the respective interconnection element frictionally contacting a surface of the respective opening, a first set of the interconnection elements being electrically connected to the first conductor and electrically disconnected from the second conductor, and a second set of the interconnection elements being electrically connected to the second conductor and electrically disconnected from the first conductor, lower socket contacts electrically connected to the interconnection elements on a lower side of the socket body, each contacting a respective upper carrier contact, and upper socket contacts electrically connected to the interconnection elements in the formation on an upper side of the socket body, the protrusion on one of the interconnection elements of the first set being at the substantially the same height as the protrusion on one of the interconnection elements of the second set;

a microelectronic package, including a package body held by the socket holding formation, a microelectronic circuit held by the package body, and package terminals formed on a lower side of the body and connected to the microelectronic, each package terminal contacting a respective one of the upper socket contacts.

\* \* \* \* \*